United States Patent [19]
Hirota

[11] Patent Number: 5,445,986
[45] Date of Patent: Aug. 29, 1995

[54] METHOD OF FORMING A ROUGHENED SURFACE CAPACITOR WITH TWO ETCHING STEPS

[75] Inventor: Toshiyuki Hirota, Tokyo, Japan

[73] Assignee: NEC Corporation, Tokyo, Japan

[21] Appl. No.: 299,405

[22] Filed: Sep. 1, 1994

[30] Foreign Application Priority Data

Sep. 3, 1993 [JP] Japan .................................. 5-219370

[51] Int. Cl.⁶ ...................... H01L 21/70; H01L 27/00
[52] U.S. Cl. ......................................... 437/60; 437/47; 437/977; 437/919
[58] Field of Search ...................... 437/47, 52, 60, 919, 437/977; 156/651; 148/138

[56] References Cited

U.S. PATENT DOCUMENTS

| | | | |
|---|---|---|---|
| 5,068,199 | 11/1991 | Sandhu | 437/52 |
| 5,134,086 | 7/1992 | Ahn | 437/52 |
| 5,266,514 | 11/1993 | Tuan et al. | 437/52 |
| 5,286,668 | 2/1994 | Chou | 437/52 |

FOREIGN PATENT DOCUMENTS

| | | |
|---|---|---|
| 0553791 | 8/1993 | European Pat. Off. . |
| 0557590 | 9/1993 | European Pat. Off. . |
| 0572943 | 12/1993 | European Pat. Off. . |
| 3129873 | 6/1991 | Japan . |
| 3139882 | 6/1991 | Japan . |

OTHER PUBLICATIONS

G. Q. Lo et al., "Highly Reliable SiO₂/Si₃N₄ Stacked Dielectric on Rapid-Thermal-Nitrided Rugged Polysilicon for High-Density DRAM's", *IEEE Electron Device Letters*, vol. 13, No. 7, Jul. 1992, pp. 372–274.
Patent Abstracts of Japan, vol. 17, No. 241 (E-1364), May 14, 1993.

*Primary Examiner*—Olik Chaudhuri
*Assistant Examiner*—H. Jey Tsai
*Attorney, Agent, or Firm*—Sughrue, Mion, Zinn, Macpeak & Seas

[57] ABSTRACT

In a method of manufacturing a semiconductor device having a capacitor constituted by a lower electrode, an upper electrode, and a dielectric film arranged between the lower and upper electrodes, a polysilicon film containing a Group V element as an impurity is formed. The first etching step of forming an uneven portion on a surface of the polysilicon film is performed. The second etching step of forming an uneven portion on the surface of the polysilicon film is performed. The second etching step has an etch rate whose impurity concentration dependency is different from an impurity concentration dependency of an etch rate of the first etching step, thereby forming the uneven portion on the surface of the polysilicon film.

9 Claims, 9 Drawing Sheets

METHOD OF FORMING A ROUGHENED SURFACE CAPACITOR WITH TWO ETCHING STEPS

BACKGROUND OF THE INVENTION

The present invention relates to a method of manufacturing a semiconductor device and, more particularly, to a method of manufacturing a semiconductor device having a capacitor.

Figure 10:
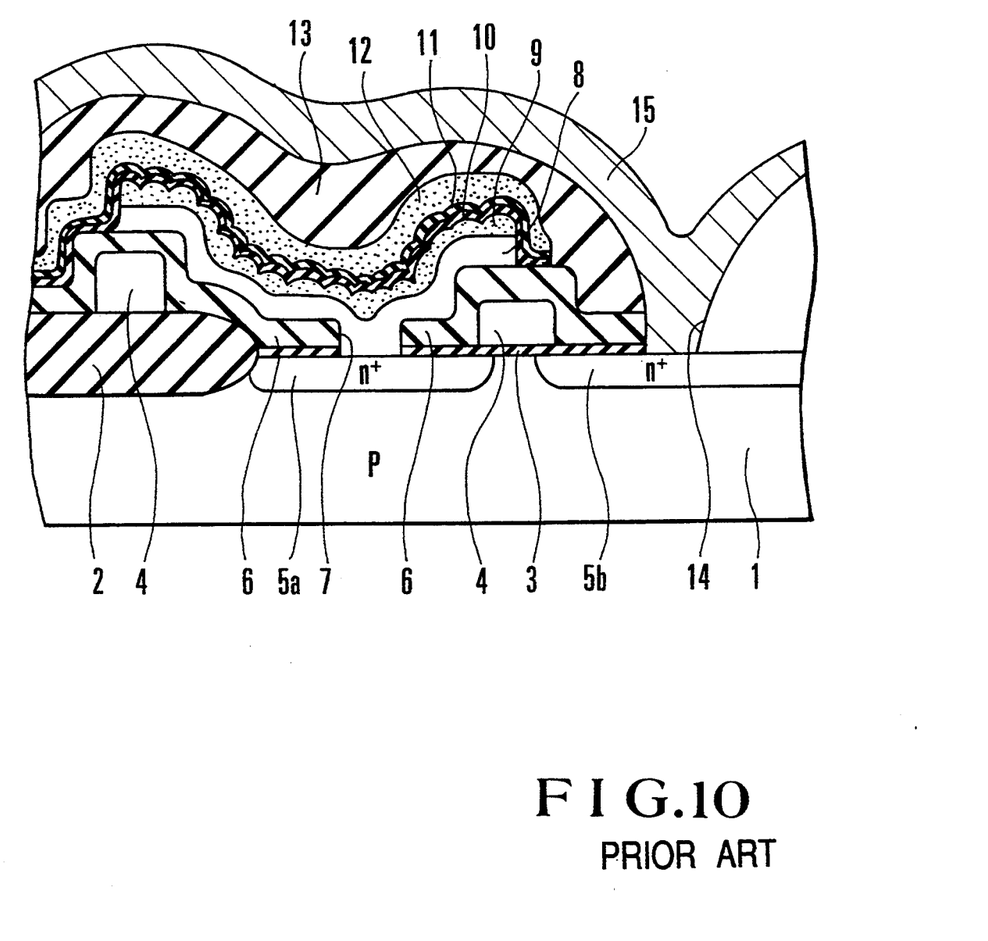
FIG. 10 is a sectional view showing a memory cell according to the prior art.

With an increase in integration density of a DRAM in which one memory cell is constituted by one transistor and one capacitor, in order to obtain a required storage charge capacitance within a limited occupied area, a method of making the surface of an electrode uneven to increase the effective surface area of the electrode is proposed. As a prior art for making the electrode surface of a capacitor uneven, a method of manufacturing a DRAM memory cell having a stacked capacitor described in Japanese Patent Laid-Open No. 3-139882 will be described below with reference to FIG. 10. Note that FIG. 10 shows the memory cell.

A field oxide film 2 for performing element isolation by a LOCOS method is formed on a p-type semiconductor substrate 1. Thereafter, the resultant structure is dried or oxidized with steam to form a gate oxide film 3 having a thickness of about 10 to 30 nm on the active region of the substrate 1. The first polysilicon film 4 having a thickness of about 100 to 300 nm is deposited on a region in which a memory cell is to be formed by an LPCVD method or the like, and phosphorus (P) is doped in the first polysilicon film 4 at a concentration of about $10^{20}$ cm$^{-3}$ by thermal diffusion using POCl$_3$ as a source. Thereafter, a resist is patterned using a normal photolithographic technique, and the polysilicon film 4 is etched using the patterned resist as a mask to form word lines 4, including gate electrodes on the gate oxide films 3, of memory cells respectively located on the field oxide film 2 and the gate oxide films 3.

Arsenic (As) is ion-implanted in the resultant structure using the word lines 4 and the field oxide film 2 as masks, and the resultant structure is annealed to form n$^+$-type diffusion layers 5a and 5b each having an arsenic concentration of about $10^{20}$ cm$^{-3}$ in the surface portion of the substrate 1. Thereafter, a silicon oxide film 6 serving as a first insulating interlayer 6 having a thickness of 100 to 300 nm is deposited on the entire surface of the resultant structure by an atmospheric-pressure CVD method or the like, and an opening is formed in the silicon oxide film 6 on a predetermined portion of the n$^+$-type diffusion layer 5a by a dry etching technique using, as a mask, a resist patterned by a normal photolithographic technique, thereby forming a contact hole 7.

Subsequently, a refractory metal silicide film, e.g., a WSi$_x$ (x=2.0 to 3.0) film 8, prospectively serving as a storage node of a memory cell is formed on the entire surface of the resultant structure by a sputtering method or the LPCVD method to have a thickness of about 100 to 200 nm. Thereafter, a second polysilicon film 9 having a thickness of 50 to 150 nm is formed on the WSi$_x$ film 8 by the LPCVD method, and phosphorus is doped in the second polysilicon film 9 at a concentration of about $10^{20}$ cm$^{-3}$ by thermal diffusion using POCl$_3$ as a source. When an impurity is doped in a polysilicon film, the impurity is segregated at grain boundaries or crystal defects such as twins in crystal grains, and portions each having a high impurity concentration are formed in the polysilicon film.

The second polysilicon film 9 is dipped in a solution of phosphoric acid heated to about 170° C. for 10 to 20 minutes. An etching process using the heated solution of phosphoric acid has an etch rate whose impurity concentration dependency is large. For this reason, in this etching process, portions each having a high impurity concentration are selectively etched. In this manner, the grain boundary of the second polysilicon film 9, i.e., polysilicon at crystal grain boundary is particularly etched, and an uneven portion is formed in the surface of the second polysilicon film 9. At this time, in order to form satisfactory an uneven portion, the phosphorus concentration of the second polysilicon film 9 must be set to be $6 \times 10^{20}$ cm$^{-3}$ or more. In addition, when a time taken for dipping the second polysilicon film 9 in the solution of phosphoric acid is prolonged, the peak-to-peak difference of the uneven portion increases. In this case, for example, even when polysilicon in each recessed portion is entirely etched, the underlying WSi$_x$ film 8 functions as an etching stopper. In addition, the second polysilicon film 9 is connected by the WSi$_x$ film 8, and disconnection caused by the uneven portion does not occur in the second polysilicon film 9. Subsequently, the second polysilicon film 9 and the WSi$_x$ film 8 are patterned using a dry etching technique using, as mask, a resist patterned by a normal photolithographic technique, and a lower electrode 9 for a memory cell located between the word lines 4 and between the word lines 4 is formed. Thereafter, an Si$_3$N$_4$ film 10 prospectively serving as a capacitor insulating film is oxidized on the entire surface of the resultant structure by the LPCVD method or the like to have a thickness of about 5 to 10 nm, and the Si$_3$N$_4$ film 10 is oxidized at 800° to 900° C. in a steam atmosphere for 30 to 60 minutes to form an oxide film 11, having a thickness of 1 to 2 nm, for increasing the breakdown voltage of the Si$_3$N$_4$ film 10. Thereafter, a third polysilicon film 12 having a thickness of 200 to 300 nm is formed on the oxide film 11 by the LPCVD method, and phosphorus is doped in the third polysilicon film 12 at a concentration of $4 \times 10^{20}$ to $6 \times 10^{20}$ cm$^{-3}$ by thermal diffusion using POCl$_3$ as a source.

Thereafter, the third polysilicon film 12 is patterned by a photolithographic technique and a dry etching technique to form an upper electrode 12 covering the lower electrode 9, thereby forming the capacitor of the DRAM memory cell. The capacitor formed as described above exhibits a storage charge capacitance about 1.2 to 1.4 times that of a capacitor on which an uneven portion is not formed.

Thereafter, a second, insulating interlayer 13 consisting of BPSG or the like is deposited on the entire surface of the resultant structure by the atmospheric-pressure CVD method to have a thickness of about 600 to 800 nm, and then is annealed at about 900° C. to smooth the second insulating interlayer 13. The second insulating interlayer 13 on a portion of the n$^+$-type diffusion layer 5b is selectively removed by etching to form a contact hole 14. Thereafter, an Al film 15 is deposited on the entire surface of the resultant structure by a sputtering method to have a thickness of about 1,000 nm, and the Al film 15 is patterned to form a bit line. In addition, a protective film is coated on the surface of the bit line, thereby completing a DRAM memory cell.

Problems to be solved by the present invention will be described below with reference to FIG. 9.

As has been described above, when an impurity is doped in a polysilicon film, the impurity is segregated at crystal grain boundaries or crystal defects such as twins in crystal grains, and portions each having a high impurity concentration are formed in the polysilicon film. In the prior art, using that portions each having a high impurity concentration is selectively etched by a heated solution of phosphoric acid, i.e., that each of the portions has an etch rate whose impurity concentration dependency is large, an uneven portion is formed on the polysilicon film surface by a single etching process.

In the prier art, a problem posed in a case wherein a ratio (selectivity ratio) of the etch rate of a portion having a high phosphorus concentration to the etch rate of a portion having a low phosphorus concentration is high, i.e., 10 or more, a problem posed in a case wherein the ratio is intermediate, i.e., 2 to 10, and a problem posed in a case wherein the ratio is low, i.e., 1 to 2 will be described below.

Figure 9A:
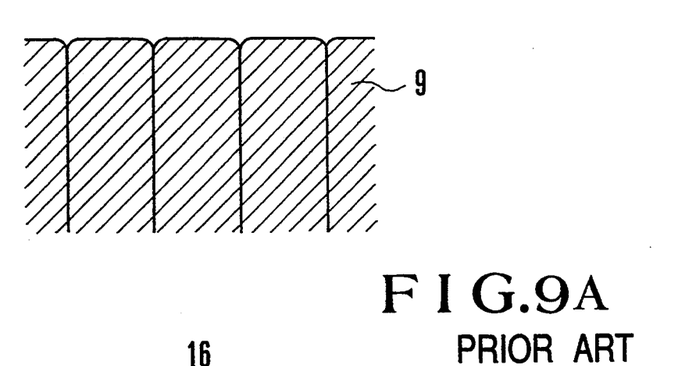
FIGS. 9A to 9D are views for explaining the problems of the prior art.
Figure 9B:
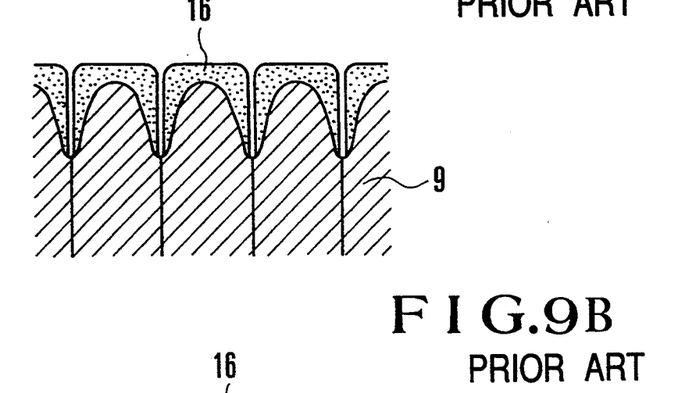

When the etching selectivity ratio is high (the impurity concentration dependency of an etch rate is large) is high, for example, assuming that the polysilicon film before an etching process is set as shown in FIG. 9A, the etching process forms groove-like (slit-like) recessed portions each having a width of about 10 nm at grain boundaries as shown in FIG. 9B.

Since the minimum thickness of a capacitor insulating film is about 5 nm, when the width of each of recessed portions to be formed is very small, the recessed portions are buried with the capacitor insulating film. For this reason, the surface area of a counterelectrode (upper electrode) does not easily increase. When portions each having a high impurity concentration are segregated at defects in crystal grains, a porous silicon layer 16 having a several-nm-level structure is formed on the surfaces of the crystal grains. The porous silicon layer 16 is easily depleted because the porous silicon layer 16 has a very fine structure, thereby causing a decrease in storage charge capacitance. In addition, since needle-like projecting portions are present on the surface of the porous silicon layer 16, electric field concentration locally occurs in a capacitor insulating film, thereby causing an increase in leakage current or degradation of reliability. Moreover, the projecting portions form pinholes, thereby decreasing a yield.

Figure 9C:
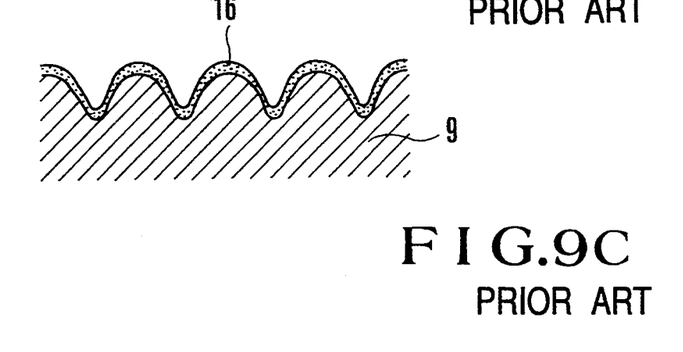

A case wherein an etching selectivity ratio is 2 to 10 is shown in FIG. 9C. In this manner, when the selectivity ratio is set to be an intermediate value, the width of each recessed portion increases, but the depth of each recessed portion decreases. In addition, although the thickness of the porous silicon layer 16 decreases, the porous silicon layer 16 cannot be easily prevented from being formed as long as selective etching is performed. Therefore, the above problem is left unsolved.

Figure 9D:
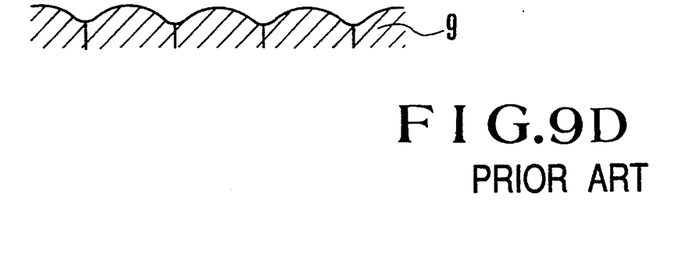

When an etching process having a selectivity ratio of about 1 to 2 is performed, as shown in FIG. 9D, a surface on which a porous silicon layer is rarely present can be obtained. However, the uneven portion is also moderated, and, therefore, an electrode surface area rarely increases.

As described above, in the prior art in which the uneven portion is formed on the lower electrode 9 by a single etching process, the depth and width of each recessed portion cannot be independently controlled, and a capacitor which has a sufficiently controlled surface shape and satisfies conditions such as a high storage charge capacitance, a high yield, a low leakage current, and high reliability cannot be easily realized.

SUMMARY OF THE INVENTION

It is an object of the present invention to provide a method of manufacturing a semiconductor device capable of forming a highly reliable capacitor having a storage charge capacitance larger than that of a prior art.

It is another object of the present invention to provide a method of manufacturing a semiconductor device capable of forming a capacitor at a yield higher than that of the prior art in addition to the above object.

It is still another object of the present invention to provide a method of manufacturing a semiconductor device capable of making a leakage current smaller than that of the prior art.

In order to achieve the above objects, according to the present invention, there is provided a method of manufacturing a semiconductor device having a capacitor constituted by a lower electrode, an upper electrode, and a dielectric film arranged between the lower and upper electrodes, wherein the lower electrode is formed by comprising the step of forming a polysilicon film containing a Group V element as an impurity, the first etching step of forming an uneven portion on a surface of the polysilicon film, and the second etching step of forming an uneven portion on the surface of the polysilicon film, and the second etching step having an etch rate whose impurity concentration dependency is different from an impurity concentration dependency of an etch rate of the first etching step, thereby forming the uneven portion on the surface of the polysilicon film.

DESCRIPTION OF THE PREFERRED EMBODIMENTS

The present invention will be described below with reference to the accompanying drawings.

Figure 1:
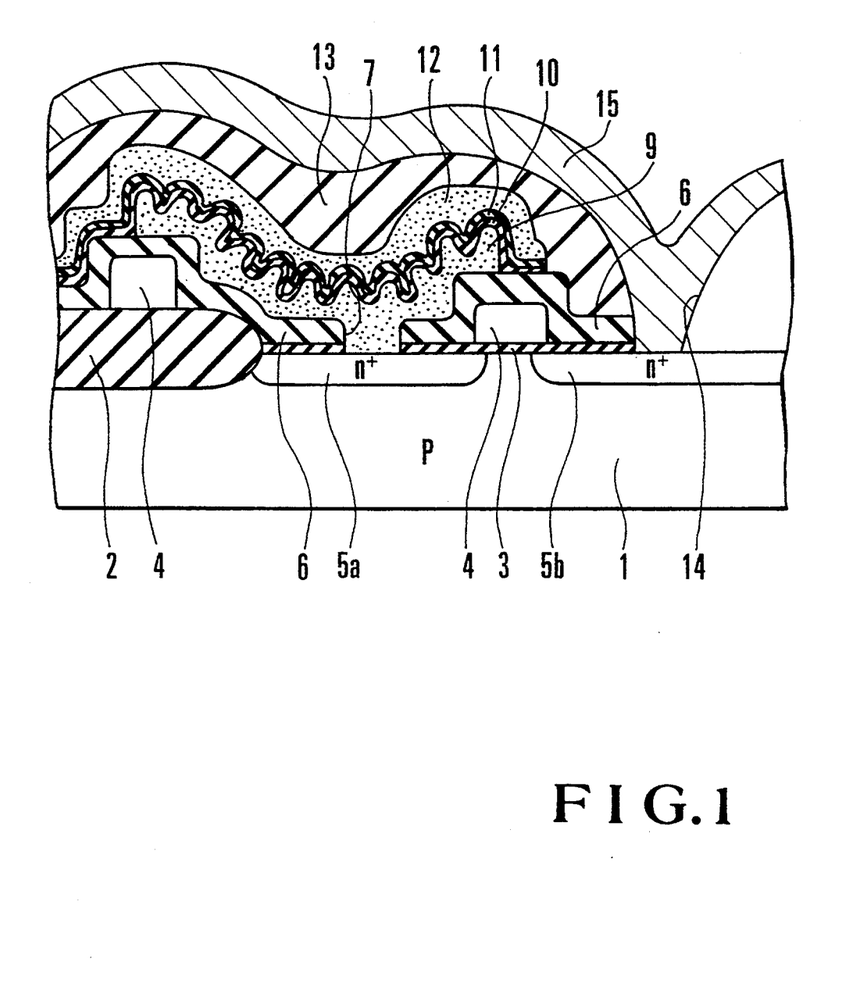
FIG. 1 is a sectional view showing a memory cell according to an embodiment of the present invention.
Figure 2A:
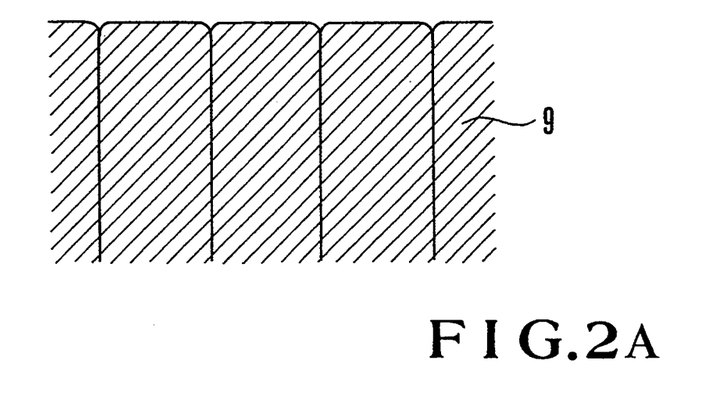
FIGS. 2A to 2C are sectional views showing the steps of making a lower electrode uneven according to the embodiment of the present invention.
Figure 2B:
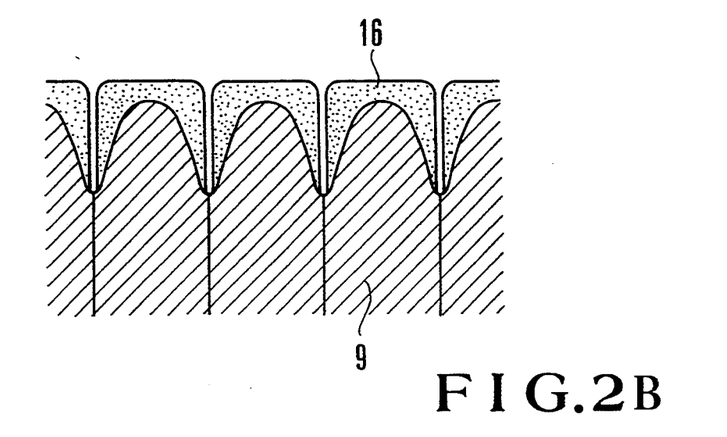

An embodiment of the present invention will be described below with reference to FIGS. 1 to 2C. FIG. 1 shows a DRAM memory cell manufactured according to an embodiment of the present invention, and FIGS. 2A to 2C show the steps of making the surface of a lower electrode 9 uneven in the embodiment of the present invention.

As in the prior art, a field oxide film 2, a gate oxide film 3, word lines 4 each consisting of a first polysilicon film including a gate electrode, diffusion layers 5a and 5b prospectively serving as a source and a drain, and a silicon oxide film 6 serving as a first insulating interlayer are formed on a semiconductor substrate 1, and an opening is formed in the silicon oxide film 6 on a predetermined portion of the n+-type diffusion layer 5a to form a contact hole 7.

Subsequently, a second polysilicon film 9 prospectively serving as a storage node (lower electrode 9) of a memory cell is formed by a LPCVD method to have as thickness of 200 to 400 nm. This second polysilicon film 9 has a column-like crystal structure as shown in FIG. 2A.

Phosphorus is doped in the second polysilicon film 9 at a concentration of about $10^{20}$ cm$^{-3}$ by thermal diffusion using POCl$_3$ as a source. In this embodiment, after the second polysilicon film 9 is formed, phosphorus serving as an impurity is doped by thermal diffusion. However, this impurity may be doped simultaneously with ion implantation or deposition of the second polysilicon film 9. In addition, arsenic may be used as the impurity to be doped.

The second polysilicon film 9 is patterned using a dry etching technique using a resist patterned by a normal photolithographic technique to form a lower electrode 9 for a memory cell located on the word lines 4 and between the word lines 4.

Figure 3A:
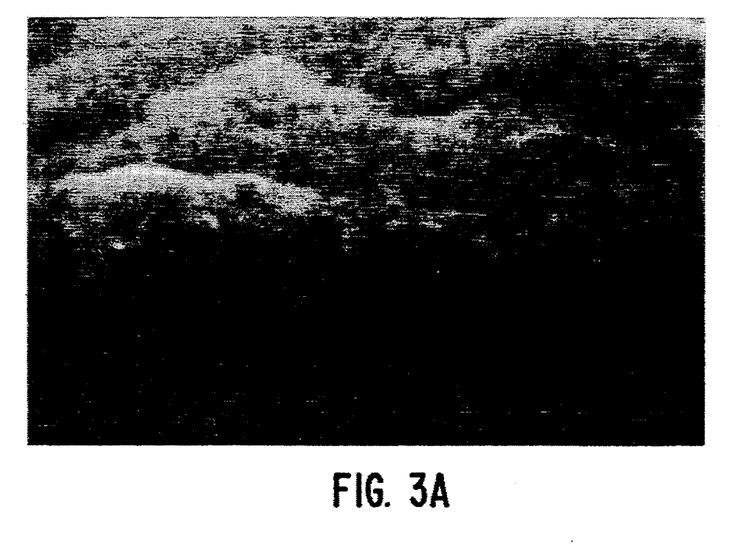
FIGS. 3A and 3B are SEM photographs showing the section and surface shape of the lower electrode after the first etching process and after the second etching process according to the embodiment of the present invention.

A first etching process having an etch rate whose impurity concentration dependency is large (selectivity ratio: 10 or more) is performed to the second polysilicon layer 9. For example, when the second polysilicon film 9 is exposed to or dipped into a solution of phosphoric acid heated to about 140° to 170° C. for about 60 to 90 minutes, the grain boundaries, i.e., the crystal grain boundaries of the second polysilicon film 9 are particularly etched, and slit-like deep recessed portions are formed in the surface of the second polysilicon film 9. At the same time, portions each having a high impurity concentration and segregated at defects in the crystal grains are etched. For this reason, the surface of the polysilicon film is changed to have a porous structure. The second polysilicon film 9 in this state is shown in FIG. 2B. FIG. 3A shows the SEM photograph of the section and surface shape of the second polysilicon film 9 treated with the heated solution of phosphoric acid. As is apparent from FIG. 3A, a porous silicon layer having a several-nm-level structure is formed on the film surface. Note that, in this embodiment, although the heated solution of phosphoric acid is used in the first etching process, any solution which can selectively etch the crystal grain boundaries of polysilicon may be used in the first etching process. For example, the second polysilicon film may be etched such that the second polysilicon film is exposed to a solution mixture of a hydrofluoric acid, a nitric acid, and a glacial acetic acid. In addition, in this embodiment, although the etching process is performed in a liquid phase, the second polysilicon film may be etched such that the second polysilicon film is exposed to a plasma containing CCl$_2$F$_2$ and N$_2$.

A second etching process having an etch rate whose impurity concentration dependency is small (selectivity ratio: about 1 to 2) is performed. The surface of the second polysilicon film is etched to a depth of several nm by the second etching process to increase the width of each recessed portion, and a porous silicon layer 16 is removed by the second etching process to smooth the uneven surface. In this etching process, for example, an ammonia-hydrogen peroxide solution can be used. However, a solution, such as a diluted solution mixture of a hydrofluoric acid and a nitride acid, having an etch rate which rarely depends on an impurity concentration and can isotropically etch the silicon surface may be used in the second etching process. In this embodiment, although the second etching process is performed in a liquid phase, the second etching process may be performed such that the second polysilicon layer is exposed to a plasma containing CF$_4$ and O$_2$ or a plasma containing SF$_6$.

Figure 2C:
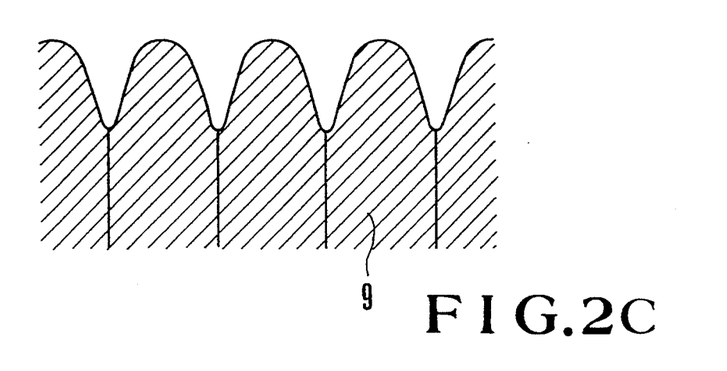
Figure 3B:
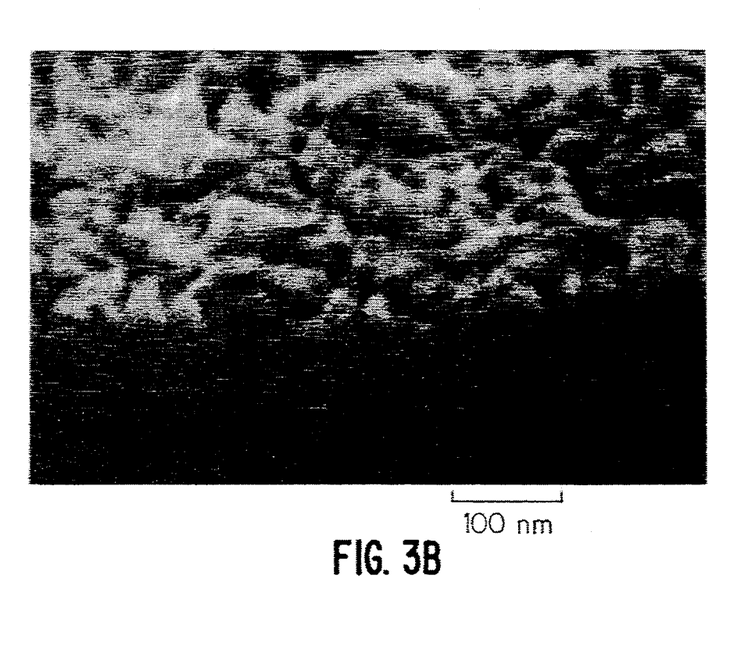
Figure 4:
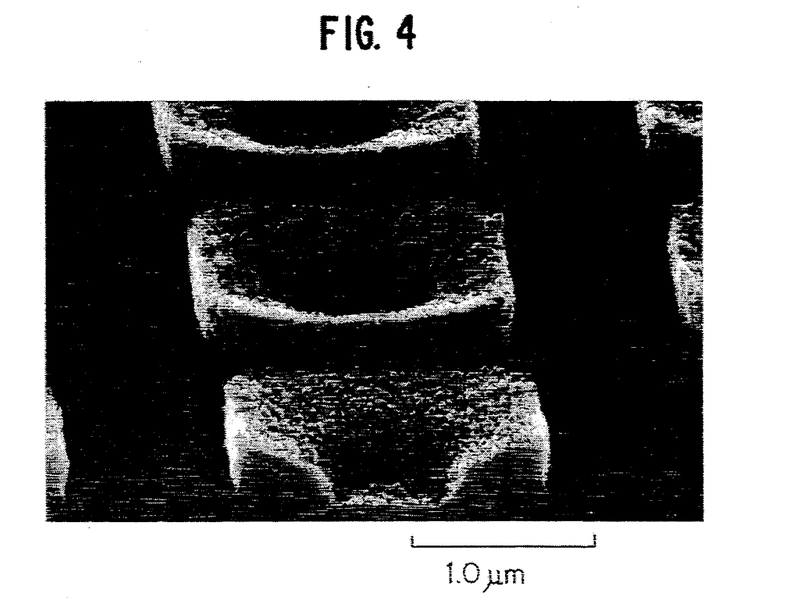
FIG. 4 is an SEM photograph showing the lower electrode according to the embodiment of the present invention.

FIG. 2C shows the second polysilicon film 9 treated by exposing it to an ammonia-hydrogen peroxide solution. FIG. 3B shows the SEM photograph of the surface and section of the second polysilicon film 9 treated with the ammonia-hydrogen peroxide solution. As is apparent from FIG. 3B, the porous silicon layer is removed, and an uneven portion having a size of a several-tens-nm level is formed. FIG. 4 shows the SEM photograph of the lower electrode 9 formed as described above.

In this embodiment, after the second polysilicon layer 9 is patterned, its surface is made uneven. However, after the surface of the second polysilicon film 9 is made uneven, the second polysilicon film 9 may be patterned.

Thereafter, the surface of the second polysilicon film 9 is treated with a solution of diluted hydrofluoric acid to remove a spontaneous oxide film formed on the surface of the second polysilicon film 9. Rapid thermal nitriding is performed in an ammonia atmosphere at 800° to 1,000° C. to prevent a spontaneous film from being grown again, thereby preventing a decrease in storage charge capacitance.

Thereafter, an Si$_3$N$_4$ film 10 having a thickness of about 5 to 10 nm and prospectively serving as a capacitor insulating film is formed on the entire surface of the second polysilicon film 9 by the LPCVD method using a gas system consisting of NH$_3$ and SiH$_2$Cl$_2$, and the Si$_3$N$_4$ film 10 is oxidized in a steam atmosphere at 800° to 900° C. for about 30 to 60 minutes, thereby forming a 1- to 2-nm thick oxide film 11 for increasing the breakdown voltage of the Si$_3$N$_4$ film 10. A third polysilicon film 12 is formed on the oxide film 11 by the LPCVD method to have a thickness of 200 to 300 nm, and phosphorus is doped in the third polysilicon film 12 at a concentration of $4 \times 10^{20}$ to $6 \times 10^{20}$ cm$^{-3}$ by thermal diffusion using POCL$_3$ as a source.

Note that, in this embodiment, after the third polysilicon film 12 is formed, phosphorus is doped as an impurity by thermal diffusion. However, the impurity may be doped simultaneously with deposition of the third polysilicon film 12. In addition, arsenic may be doped as the impurity.

Thereafter, the third polysilicon film 12 is patterned using a photolithographic technique and a dry etching technique to form an upper electrode 12 covering the lower electrode 9, thereby forming a capacitor. The capacitor formed as described above exhibits a storage charge capacitance about 2.1 times that of a capacitor in which an uneven port on is not formed. As in the prior art in FIG. 10, a second insulating interlayer 13, a contact hole 14, an Al film 15 serving as a bit line, and a protective film (not shown) are formed, thereby completing a DRAM memory.

Figure 5A:
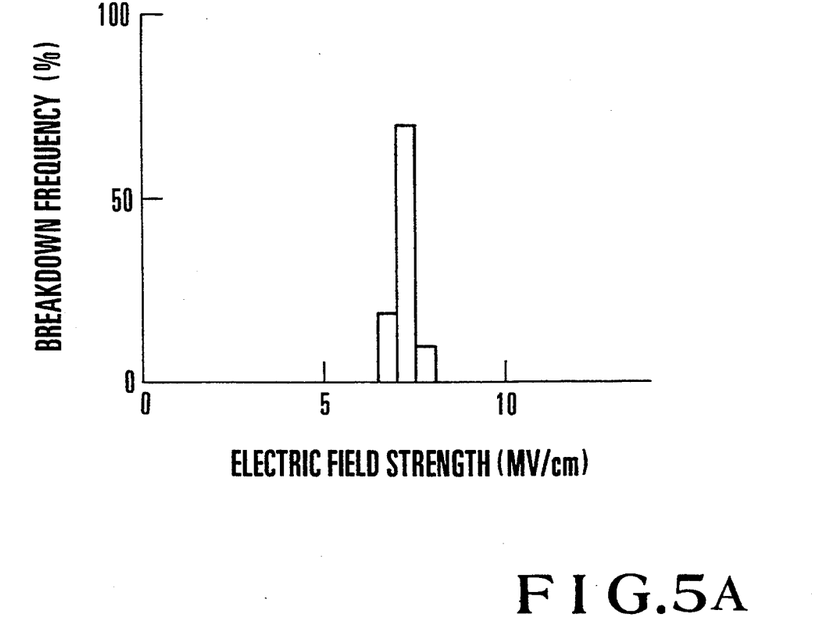
FIGS. 5A and 5B graphs showing the breakdown-voltage distribution of a capacitor according to the present invention and the breakdown-voltage distribution of a capacitor according to the prior art, respectively.
Figure 5B:
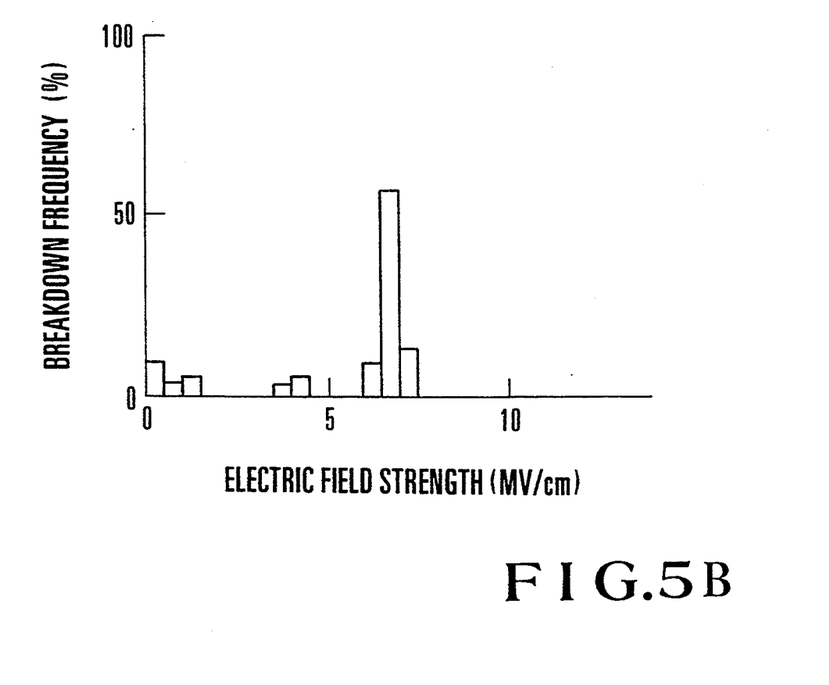

FIGS. 5A and 5B show the breakdown-voltage distribution of the capacitor (FIG. 5A) according to this embodiment and the breakdown-voltage distribution of the capacitor (FIG. 5B) according to the prior art, respectively. Assuming that a capacitor which is broken at an electric field strength of less than 5 MV/cm is defined as a defective capacitor, capacitors according to this embodiment rarely include defective capacitors which are detected in capacitors of the prior art. Therefore, it is found that the yield of the present invention increases.

Figure 6:
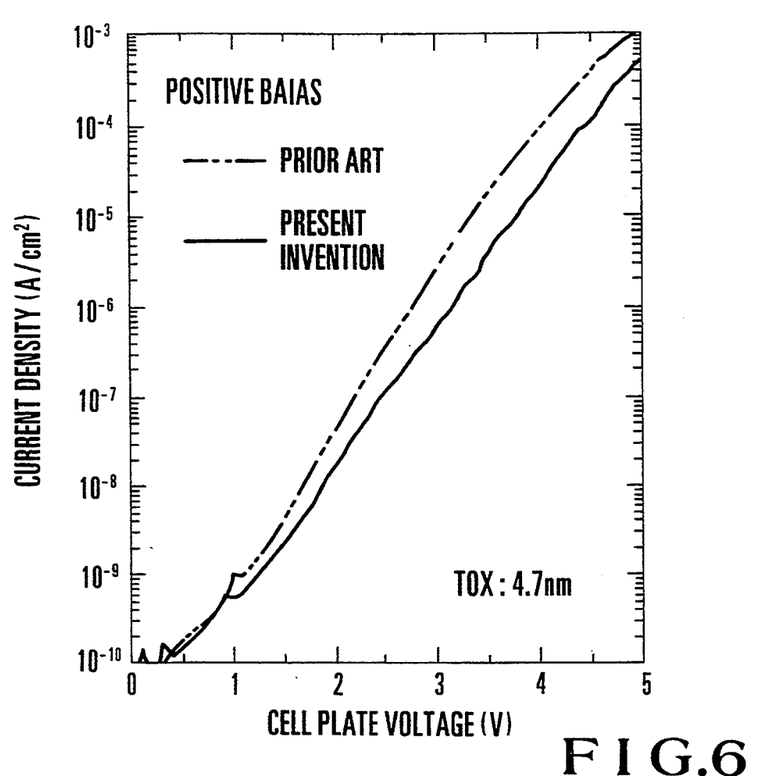
FIG. 6 is a graph showing the leakage current density-voltage characteristics of the capacitors according to the present invention and the prior art.

FIG. 6 shows the leakage current density-voltage characteristics of a capacitor according to the above embodiment of the present invention. It is found that data obtained in the embodiment of the present invention and indicated by a sold line has a leakage current smaller than that of data obtained by the capacitor according to the prior art and indicated by a chain triple-dotted line.

Figure 7:
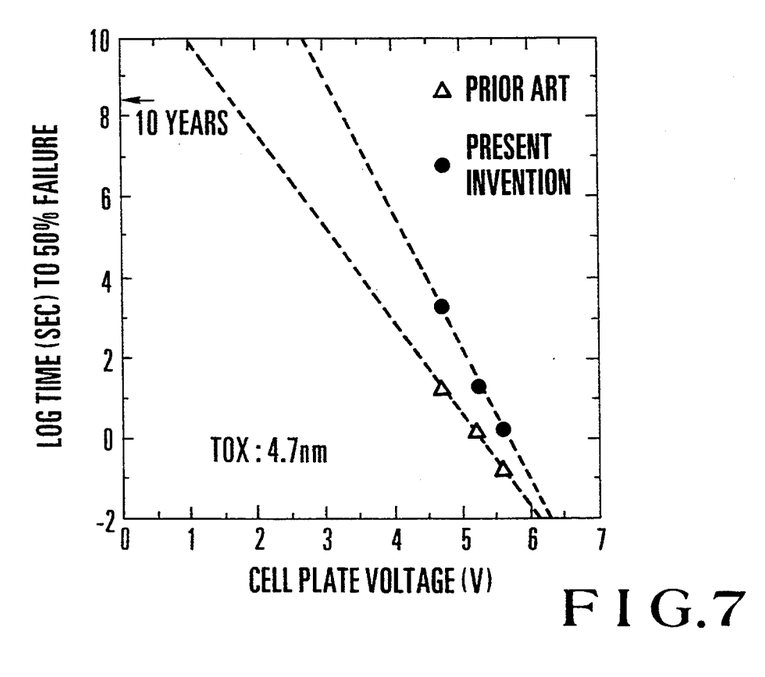
FIG. 7 is a graph showing the applied voltage dependency characteristics of the service lives of the capacitors according to the present invention and the prior art.

FIG. 7 shows the relationship between a time taken until 50% capacitors are dielectrically broken down and a voltage applied to each capacitor. As is apparent from FIG. 7, each of the capacitors indicated by black circles (●) according to the present invention has a service life longer than each of the capacitors indicated by white triangles (△) according to the prior art.

According to another embodiment of the present invention, the second etching process may be performed as a combination of the process of oxidizing a polysilicon surface and the process of removing the oxidized portion with a hydrofluoric acid.

Figure 8:
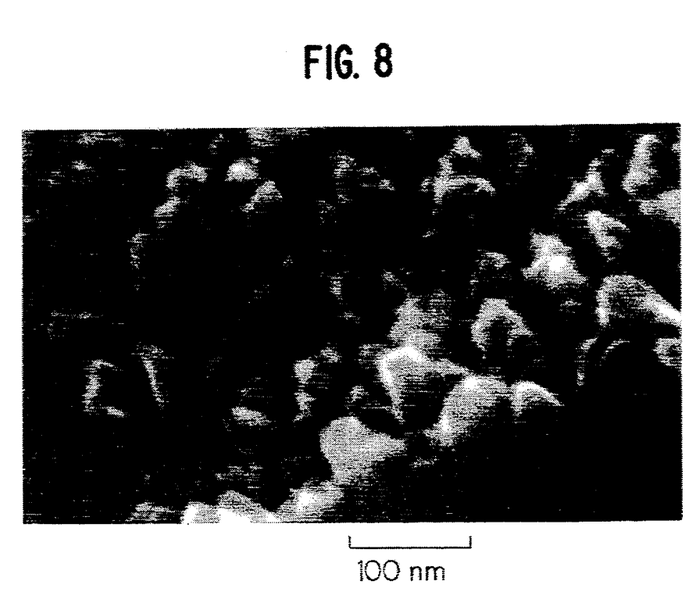
FIG. 8 is an SEM photograph showing the section and surface shape of a lower electrode after the second etching process according to another embodiment of the present invention.

For example, as in the above embodiment, a second polysilicon film 9 prospectively serving as the lower electrode of a memory cell is formed by the LPCVD method to have a thickness of 400 nm, and phosphorus is doped in the second polysilicon film 9 at 850° C. for 30 minutes by thermal diffusion using $POCl_3$ used as a source. As the first etching process, the resultant structure is dipped in a solution of phosphoric acid heated to 160° C. for 90 minutes. Thereafter, as the second etching process, the resultant structure is oxidized in a dry oxygen atmosphere heated to 850° C. for 30 minutes and then treated with a solution of 1% diluted phosphoric acid. FIG. 8 shows the SEM photograph of the lower electrode after the second etching process. Since the size of each crystal grain is larger than that of the previous embodiment, the size of the uneven portion is larger than that of the previous embodiment. However, as in the previous embodiment, an uneven portion is formed without a porous silicon layer.

As has been described above, according to the present invention, the depth and width of each recessed portion on the uneven surface of a polysilicon film can be independently controlled by the first and second etching processes. For this reason, an uneven surface shape can be easily obtained, and a storage charge capacitance can be effectively increased. In addition, a porous silicon layer which is formed by the first etching process and is left in the prior art can be removed by the second etching process. For this reason, according to the present invention, a leakage current smaller than that of the prior art can be obtained, a breakdown voltage can increase to result in an increase in yield, and the reliability is improved.

In the prior art, since an uneven portion is formed by a single etching process, the depth and width of each recessed portion must be simultaneously controlled. For this reason, in order to form recessed portions each having a sufficient width, the etching process must be continuously performed until polysilicon in each recessed portion is entirely etched. Therefore, the $WSi_x$ film 8 must be formed as an underlying layer not to disconnect crystal grains from each other. However, according to the present invention, since the depth and width of each recessed portion can be independently controlled, the etching process need not be continuously performed until polysilicon in each recessed portion is entirely etched. Therefore, an effect that the $WSi_x$ film 8 required in the prior art need not be formed in the present invention can be obtained.

What is claimed is:

1. A method of manufacturing a semiconductor device having a capacitor constituted by a lower electrode, an upper electrode, and a dielectric film arranged between said lower and upper electrodes, wherein said lower electrode is formed by comprising:

the step of forming a polysilicon film containing a Group V element as an impurity;

the first etching step of forming an uneven portion on a surface of said polysilicon film; and the second etching step of forming an uneven portion on the surface of said polysilicon film, and the second etching step having an etch rate whose impurity concentration dependency is different from an impurity concentration dependency of an etch rate of the first etching step, thereby forming the uneven portion on the surface of said polysilicon film.

2. A method according to claim 1, wherein an etching medium used in the first etching step has an etch rate whose impurity concentration dependency is larger than that of an etch rate of an etching medium used in the second etching step.

3. A method according to claim 2, wherein the etching media used-in the first and second etching steps are liquids.

4. A method according to claim 2, wherein the etching media used in the first and second etching steps are gases.

5. A method according to claim 1, wherein the first etching step includes the step of exposing said polysilicon film to a medium containing a phosphoric acid.

6. A method according to claim 1, wherein the first etching step includes the step of exposing said polysilicon film to a solution mixture of a hydrofluoric acid, a nitric acid, and a glacial acetic acid.

7. A method according to claim 1, wherein the second etching step includes the step of exposing said polysilicon film to a solution containing ammonia and hydrogen peroxide.

8. A method according to claim 1, wherein the second etching step includes the step of oxidizing a surface of said polysilicon prospectively serving as said lower electrode and the step of using a hydrofluoric acid.

9. A method according to claim 7, further comprising, after a process of said second etching step is performed, the step of removing a surface oxide film and the step of performing rapid thermal nitriding in an ammonia atmosphere, and then forming an insulating film of said capacitor.

* * * * *